United States Patent
Gaddam

(10) Patent No.: US 11,411,528 B2
(45) Date of Patent: Aug. 9, 2022

(54) ECO-FRIENDLY ENERGY GENERATING ROOFS

(71) Applicant: Vamsi Krishna Gaddam, Hyderabad (IN)

(72) Inventor: Vamsi Krishna Gaddam, Hyderabad (IN)

( * ) Notice: Subject to any disclaimer, the term of this patent is extended or adjusted under 35 U.S.C. 154(b) by 0 days.

(21) Appl. No.: 16/092,766

(22) PCT Filed: Nov. 14, 2017

(86) PCT No.: PCT/IB2017/057088
§ 371 (c)(1),
(2) Date: Oct. 11, 2018

(87) PCT Pub. No.: WO2018/178755
PCT Pub. Date: Oct. 4, 2018

(65) Prior Publication Data
US 2020/0014328 A1    Jan. 9, 2020

(30) Foreign Application Priority Data

Mar. 31, 2017  (IN) .............................. 201741011843

(51) Int. Cl.
*H02S 20/26* (2014.01)
*H02S 20/23* (2014.01)
(Continued)

(52) U.S. Cl.
CPC .............. *H02S 20/26* (2014.12); *E04D 3/352* (2013.01); *E04D 3/40* (2013.01); *E04F 13/074* (2013.01);
(Continued)

(58) Field of Classification Search
CPC .......... H02S 40/22; H02S 40/40; H02S 20/26; H02S 20/23; H02S 20/25; H01L 31/054;
(Continued)

(56) References Cited

U.S. PATENT DOCUMENTS 4,089,705 A *  5/1978  Rubin .................... H01L 31/042
                                                          136/244
10,672,919 B2 *  6/2020  Kang .................. H01L 31/0488
(Continued)

FOREIGN PATENT DOCUMENTS

CN         101144318 A      3/2008
CN         201620532 U      11/2010
(Continued)

OTHER PUBLICATIONS

Office Action, dated Jul. 25, 2019, in Indian Application No. 201741011843.
(Continued)

*Primary Examiner* — Phi D A
(74) *Attorney, Agent, or Firm* — Knobbe, Martens, Olson & Bear LLP

(57) ABSTRACT

Present invention relates to the field of Building Integrated Solar systems that help in generating electricity. It is a solar board that can be used as a roof, façade or other building applications. It also relates to a method of preparing, designing and producing the Solar Cement Boards by integrating the Cement boards with that of solar panels to form an envisaged single entity. The Solar Cement Board SCB comprises a plurality of Solar energy capturing components like Photo Voltaic (PV) cells or the like, sandwiched over specially treated Fiber cement board or the likes. The SCB comprises of a toughened glass and/or a thin film on top, ethylene vinyl acetate film as an encapsulate in the middle, and polyvinyl fluoride film as a back sheet. The SCB with top, middle and a back sheet is laminated together with Fiber cement board or the like providing a water-resistant enclosure. This is ultimately a unique integrated solar product.

17 Claims, 5 Drawing Sheets

(51) Int. Cl.
*E04D 3/40* (2006.01)
*E04F 13/074* (2006.01)
*E04D 3/35* (2006.01)
*E04F 13/077* (2006.01)

(52) U.S. Cl.
CPC ............ *E04F 13/077* (2013.01); *H02S 20/23* (2014.12); *E04F 2290/02* (2013.01)

(58) Field of Classification Search
CPC ..... H01L 31/052; H01L 31/048; B62D 65/06; B62D 65/04; B62D 25/06; B62D 65/005; G02F 2001/0113; B60R 13/0231; E04D 3/352; E04D 3/40; E04F 13/074; E04F 13/077; E04F 2290/02; Y02E 10/50; Y02B 10/10
See application file for complete search history.

(56) References Cited

U.S. PATENT DOCUMENTS

| | | | |
|---|---|---|---|
| 2002/0026955 A1* | 3/2002 | Ouchida | H01L 31/048 136/251 |
| 2008/0135094 A1* | 6/2008 | Corrales | H01L 31/052 136/259 |
| 2008/0289272 A1 | 11/2008 | Flaherty | |
| 2010/0031997 A1* | 2/2010 | Basol | H02S 30/20 136/244 |
| 2010/0243021 A1* | 9/2010 | Lee | H01L 31/022425 136/244 |
| 2011/0138711 A1 | 6/2011 | Seng | |
| 2011/0274862 A1* | 11/2011 | Yaguchi | B32B 7/06 428/40.1 |
| 2013/0160824 A1 | 6/2013 | Khouri | |
| 2015/0136207 A1* | 5/2015 | Giron | B62D 29/043 136/251 |
| 2015/0144180 A1* | 5/2015 | Baccini | B32B 27/306 136/251 |
| 2016/0308081 A1* | 10/2016 | Ishiguro | H01L 31/048 |
| 2017/0155360 A1* | 6/2017 | Hahn | H02S 40/22 |
| 2018/0115275 A1* | 4/2018 | Flanigan | H02S 40/34 |
| 2018/0222537 A1* | 8/2018 | Sakabe | B62D 25/06 |

FOREIGN PATENT DOCUMENTS

| | | |
|---|---|---|
| CN | 102277985 A | 12/2011 |
| CN | 202627344 U | 12/2012 |
| CN | 103206049 A | 7/2013 |
| CN | 103586973 A | 2/2014 |
| CN | 103967229 A | 8/2014 |
| CN | 105507514 A | 4/2016 |
| CN | 106193464 A | 12/2016 |
| EP | 2 190 032 A1 | 5/2010 |
| JP | 11150287 A | 6/1999 |
| JP | H 11150287 A | 6/1999 |
| WO | WO 2008/079436 A2 | 7/2008 |
| WO | WO 2008/079436 A3 | 7/2008 |

OTHER PUBLICATIONS

Office Action dated Dec. 2, 2020 in Chinese Patent Application No. 201780025437.2.

* cited by examiner

ECO-FRIENDLY ENERGY GENERATING ROOFS

CROSS REFERENCE

The present invention claims priority on India Provisional Application No. 201741011843 dated 31 Mar. 2017 titled 'ECO-FRIENDLY ENERGY GENERATING ROOFS', which is incorporated herein by reference.

TECHNICAL FIELD OF THE INVENTION

Present invention relates to the field of load bearing building integrated solar cement boards that generate electricity. The inventive solar boards herein disclosed, forms energy generating roofs, façades and other structures. It also relates to a method of designing, preparing and producing these solar boards.

BACKGROUND OF THE INVENTION

The increased use of fossil fuels, coal and other non-renewable resources generating power emit harmful carbon emissions in to the atmosphere. These carbon emissions have a negative impact on the environment increasing global temperatures drastically thereby giving way to several natural disasters. It is imperative to reduce the carbon emissions by using more of renewable energy resources like wind and solar for power generation.

Individuals and businesses have been attracted to solar power not just to the environmental benefits it gives, but also to the ability to generate their own power. Solar, or photovoltaic (PV), panels have been used for decades to create usable electrical power by harnessing the sun's energy. PV panels are usually mounted in suitable locations for maximum exposure to the sun. Frequently, these locations include building rooftops, both industrial and residential. Accordingly, various methods and devices have been developed for mounting PV panels on the roofs of buildings.

The most common Solar, or photovoltaic product used for rooftop solutions consists of a stand-alone solar panel, which mounts onto an existing roof or structure, using frame supports or direct mounting to the structure. These products are used in addition to, and not in place of, existing roof structures. The wiring systems for these photovoltaic arrays use traditional parallel or series circuits, and standard crimp or lug type connections.

Usually, solar or photovoltaic modules are mounted by assembling screws, nuts, and bolts to the appropriate mounting structures which is a frame external to the roof or on roof top or terrace spaces. As such, the mounting process often involves attaching the hardware in difficult, awkward and not readily accessible locations such as on rugged terrain, or uneven roof tops. Existing mounting structures are often overly complicated and difficult to fabricate and install. In addition, many mounting structures contain too many components to install the panels. Considering the systems and methods, the adaptation to solar is very limited as of now. There is a pressing need to develop a more effective method and use of a solar product that is required for the country at large.

Another major hurdle is the method of construction and the feasibility or the convenience to switch to solar once a roof is decided. To drive solar in a large way, it may be vital to convert the many empty spaces over a roof which are in abundance in towns and cities.

The other issues pertaining to adapt solar as a solution for clean energy as a roof top solution are that a) the existing roofs are not designed to take any excess load over which the solar modules would have to be mounted on b) It is a cumbersome and expensive process to redo and to reinforce the existing structure to adapt to the additional load of the solar.

Present roofing solutions in the conventional mode are tailor made to meet the requirements relating to only one purpose that is to provide shelter. Existing metal sheets used as roofing solutions have a very high thermal transmittance thereby making the roof un-suitable to live and work under humane conditions and thus, viewed from this dimension also, there is a need to develop a better roofing solution. When compared with conventional roofing solutions the temperature incidence is 4-5 degrees Celsius less low using the proposed boards.

The existing 'metal' roofing solutions are dangerous if an occurrence of a fire accident in the premises. Due to elevated temperature transmittance in to the building, makes it uncomfortable to stay under the roof. Prolonged exposure of metal roof to rain results in rusting of roof in the long run. Once rusted the strength of the roof weakens and susceptible to collapse or deform during high winds.

U.S. Pat. No. 5,768,831A discloses about a roof tile made of a plate of clay, ceramic, concrete, fiber cement or synthetic, serving as a carrier for a solar panel with photovoltaic solar cells attached on the upper side. The solar panel is form-fittingly attached to the upper side of the roof tile/roof slate/wall plate with at least two sides opposite to one another at the inner edges of an indent of a roof tile/roof slate/wall plate.

European patent application EP 0 440 103 A2 discloses a solar panel attached to the upper side of a roof tile. The solar panel is attached form-fittingly such that the material of the roof tile/roof slate protrudes at least on two opposite sides such that it reaches over one area, particularly the edge of the solar panel which secures the solar panel from being lifted off. The solar panel is, particularly from above, pressed onto the roof tile and, due to its own flexibility, hooks into a recess of the roof tile.

In both the cases, it is apparent that roof tiles have liberal production tolerances making the fit of the solar panels insufficient; they are either seated too loosely on the roof tile or are too large to fit.

JP-A-3124 070 discloses solar cells that are mounted in a common frame with metal hooks attached to the bottom of the solar cells such that the hooks engage in the frame. CN201620531U discloses a base material board and a solar-cell panel, wherein the solar-cell panel is distributed on the front surface of the base material board, the solar-cell panel comprises a transparent (TPT) layer and a solar-cell plates from up to down, the solar-cell panel and the base material board are connected through EVA encapsulation or lamination or adhesive or potting curing, the back surface of the base material board is provided with at two hanging slots and at least one wiring slot, wherein the hanging slots can enable two base material boards and the wall surface to be hung and combined by a latch, and the wiring slot is arranged between the hanging slots.

U.S. Pat. No. 9,590,557B2 discloses a masonry unit including a photovoltaic cell for generation of electricity is described herein. More particularly a photovoltaic-clad concrete block that combines the structural attributes of concrete block (or other masonry unit) and the energy production of solar photovoltaic is described herein. Methods for manufacturing, installing, and electrically connecting such photovoltaic-clad concrete blocks are also described herein.

U.S. Pat. No. 9,647,159B2 discloses a photovoltaic panel comprising a back plate, a front sheet and a photovoltaic cell disposed between the back plate and the front sheet, wherein the photovoltaic panel comprises a protective element which extends along an edge of the front sheet without extending beyond an uppermost surface of the front sheet.

Disadvantage of these known photovoltaic panels are that the upper surface tends to trap water, dirt, leaves and the like due to the protruding outer frames, which can lead to a deterioration in the performance, or even failure, of the panel. Moreover, as the housing surrounding the layers extends outwardly of the sides and upper layer, the panel is very noticeable, and thus unsuitable for aesthetically-sensitive applications.

In conventional solar roofing gaps provided between the panels is normally 50 mm and in between the solar panel rows is 600 mm to 1000 mm to avoid shadow effects. This arrangement wastes a lot of space resulting in less power generation when compared with present solar cement boards. Thus, the extra chance of generating 20-30% more power in the same space is lost.

Looking at the above facts it is felt that the present day need is to provide a roofing solution which serves both as a roof and generates electricity simultaneously. This roofing in addition to just being a comfortable shelter can utilize a perpetual renewable energy source i.e. sun light for producing electricity, thus saving Mother Earth from polluting gases generated from other forms of energy generation. It is imperative to stress here that there are no input raw materials used except sunlight and there are no gases emitted during power generation. Hence no scrap is generated like ash in case of coal based power generation and no carbon emissions.

BRIEF SUMMARY OF THE INVENTION

Present invention is one step closer towards making our planet greener and more dependent on renewable energy sources. The invention is addressing each of the above pain points by providing suitable solutions and ease of conversion from traditional roofing and solar materials to a unique hybrid energy generating board.

The present invention as expressed in the title of this specification refers to eco-friendly, energy efficient, energy generating and "load bearing" boards for use on roofs, facades, walls etc., where sunlight is available.

A principle object is to combine the structural attributes of roofs and walls made of varied building integrated materials with that of solar energy. Methods for manufacturing, installing, and electrically connecting such solar energy generating boards are also described herein.

According to a first aspect of the present invention, an eco-friendly energy generating structure formed using a plurality of Solar Cement Boards (SCB's) is disclosed. The SCB's comprise a plurality of Solar energy capturing components like Photo Voltaic (PV) cells.

In accordance with the first aspect of the present invention, the SCB's are provided with a toughened glass and/or a thin film rested on a plurality of rectangular profiles along the length of board. An Ethylene Vinyl Acetate (EVA) film as an encapsulate in the middle, and a polyvinyl fluoride film over the board are used. The energy generating structure so formed provides a load bearing, leak proof, fire and thermal resistant enclosure.

In accordance with the first aspect of the present invention, the Solar energy capturing components like Photo Voltaic (PV) cells are connected in series and are sandwiched with both positive and negative terminals extended from the PV circuits and connected to external sources through a plurality of junction boxes with male and female connectors.

In accordance with the first aspect of the present invention, further the SCB combines the structural attributes of concrete slabs or walls and produces energy without additional items and is simply characterized to be supported by a rigid frame work. The integrated solar cement boards are very user friendly for installation on the steel structure just by using self-drilling screws, weather resistant sealant and a weather resistant tape. The integrated solar cement boards are laid directly on to a steel frame work and fixed to the frame by screws which makes installation very simple compared to the clamps, nuts and bolts used in the existing solar panels.

In accordance with the first aspect of the present invention, the eco-friendly energy generating board caters as an ideal solution to replace the presently used galvalume or galvanized metal roofing segment which is very poor in thermal resistance and very low load bearing capacity.

The base of solar board is specially designed with rectangular profile to increase the load bearing capacity after installing on the roof, façade or other applications. This facilitates the movement of personnel over the roof during installation and maintenance works unlike conventional solar products which are not fit to take such loads. Traditional solar roofs/mounting structures are designed with just 4 mounting bolts/nuts for each solar panel. This kind of mounting cannot withstand heavy snow loads or high wind speeds. In contrast our solar board can withstand live load of 1.5 times to the persons weight and point load up to 200 kg without any deformation or effecting the performance on power generation. Each board is mounted on to the structure using 8 self-threading/tapping screws, thus giving it the maximum strength to withstand high wind and snow loads.

The ground reaction force when someone walks on a board is in the region of 1.5 times the body weight, so every time someone steps on surface of a board while moving he pushes down with as much as 150 kg force. Our board can withstand such forces comfortably.

In accordance with the first aspect of the present invention, the uniquely made tray and mould encapsulates the solar energy generating components into the board with a web around the board used for fixing the boards with self-threading screws. The present invention is characterized to perfectly "fit" into the board itself to create a hybrid solution to generate electricity.

In accordance with the first aspect of the present invention, due to more mass of glass compared to thin film sheet, heat dissipation will be faster during power generation Glass being tempered can withstand any small impacts during installation like dropping of tools, walking on the boards, scratches while moving the materials etc.

In accordance with the first aspect of the present invention, the solar cement boards are characterized to create a hybrid solution where they are connected in series to build a roof, façade or the like becoming an integrated Solar roofing system for residential, commercial, industrial, bus stop shelters, parking lot shelters, green energy charging stations, or the like which generate electricity.

By using SCB's for the roof we can use entire roof area without any gaps between the boards. In traditional solutions it is 50 mm between the solar panels and 600 mm to 1000 mm between the solar panel rows mainly due to shadowing effect and maintenance. Thus, using SCB's yields 20% extra power generation.

According to the second aspect of the present invention, a Solar Cement Board (SCB) comprising a toughened glass and/or a thin film as a top layer, a plurality of middle layers, a plurality of Solar energy capturing components, a specially treated Fiber cement board or the like as a back board is disclosed.

In accordance with the second aspect of the present invention, the Solar energy capturing components are sandwiched in a plurality of long rectangular profiles in the Fiber cement board or the like and the top layer rested on a plurality of webs between the long rectangular profiles to strengthen the board and avoid top loads getting transferred to the Solar energy capturing components.

In accordance with the second aspect of the present invention, the SCB further comprises a junction box and electrical connectors for connecting the panel to an outer electrical network and is disposed on the underside of the board.

In accordance with the second aspect of the present invention, the back board may be of an alternate Building integrated material like calcium aluminate, Portland cement, or pozzolanic type. Further, the back board may be of ceramic or a plastic plate.

In accordance with the second aspect of the present invention, the solar energy generating components may be crystalline silicon solar cells, amorphous silicon solar cells, or any other solar cells.

In accordance with the second aspect of the present invention, the SCB is characterized to create a hybrid solution where they are connected in series to build a roof, façade or the like, becoming an integrated Solar roofing system for residential, commercial, industrial, bus stop shelters, parking lot shelters, green energy charging stations, or the like which generate electricity.

According to the third aspect of the present invention, a method of making an SCB meant for external applications is disclosed. The method comprises steps of subjecting a base Fiber cement board or the like to drying or dehydrating, sanding and dusting thereafter coating the Fiber cement board or the like to improve its hydrophobic nature with water repellents like Polyurethane (PU) and laminating the treated board with Solar energy capturing components like Photo Voltaic (PV) cells sandwiched with a toughened glass and/or a thin film, ethylene vinyl acetate film as an encapsulate in the middle, and polyvinyl fluoride film as a back sheet.

According to the second aspect of the present invention, further the embedded solar energy capturing components are sandwiched with specially designed Fiber cement board or the like to form a single seem less laminated unit to be called as Solar Cement Board (SCB).

In accordance with the second aspect of the present invention, further the SCB is characterized to form a friendly roof with multipurpose utilities, serving as a roof and producing electrical energy simultaneously. Considering the solar roof as a revenue generating source, our solar roof will generate 20% extra power due to optimum usage of space resulting in a payback period of around 4-6 years in comparison with a traditional solar system with a payback period ranging from 8 to 10 years.

BRIEF DESCRIPTION OF THE DRAWINGS

Other objects and advantages of the present invention will become apparent to those skilled in the art upon reading the following detailed description of the preferred embodiments, in conjunction with the accompanying drawings, wherein like reference numerals have been used to designate like elements, and wherein.

DETAILED DESCRIPTION OF THE INVENTION

For a typical residential Solar roof, installers first study the design plans, measure the roof, and note where the panels will be installed. After locating the roof rafters, installers bolt L-shaped feet through the roof and deep into these rafters, creating a strong anchor point. These L-feet and rails are known as the "racking" of the system. Solar panels, which have a sturdy aluminum frame around each edge (sort of like a picture frame), are then bolted to the railings using heavy-duty metal clips.

Because the racking and solar panel frames are metal, lightning is a grave concern and so all the equipment is grounded with a heavy copper wire that runs from the solar system all the way down the roof and tied into the home's ground.

The solar cement board as disclosed herein is an innovative solution to replace Metal roofs with an inbuilt solar power generating components. It has various advantages in which the primary use is that it is directly used as a roof instead of traditional solutions such as Metal sheets or Tiles. It generates electrical energy at the same time constituting as only one specific product for the use of roof, façade or any building/structure covering application. Another important aspect is that it has a high thermal resistance thereby transmitting lesser heat into the building. Along with this another unique feature is that it has a very high aesthetic appeal compared to a traditional solar system.

Figure 1A:
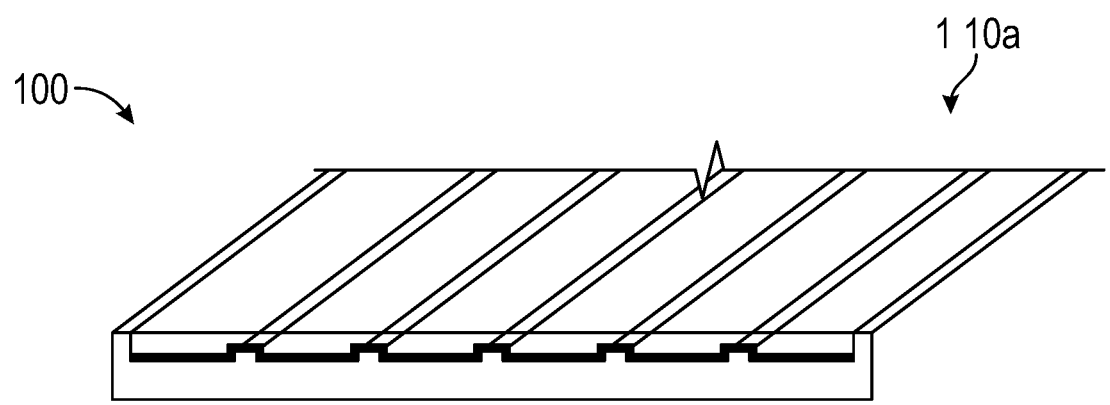
FIGS. 1a & 1b illustrates an arrangement of solar cement board with an in built solar power generating components.
Figure 1B:
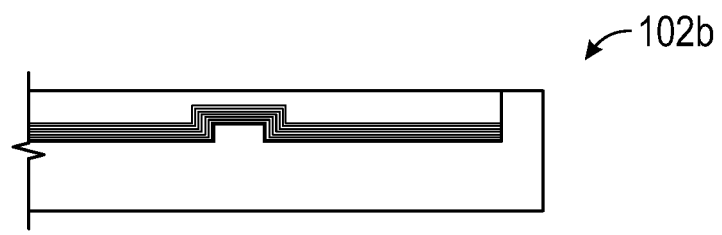
Figure 3A:
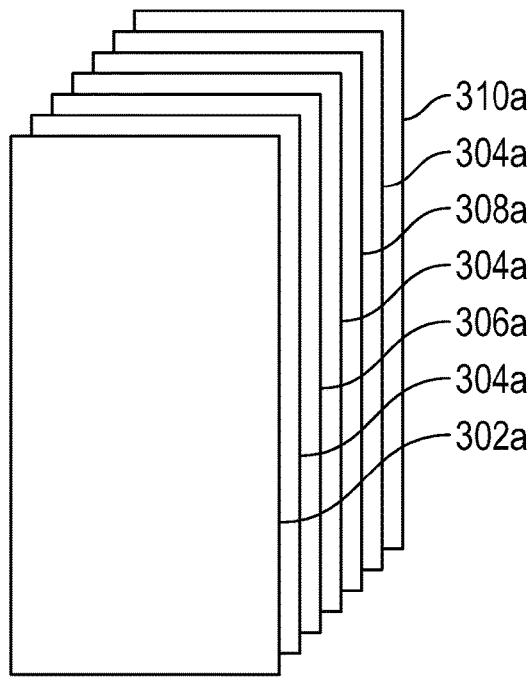
FIGS. 3a & 3b illustrates layers of an SCB made with thin film and with glass.
Figure 3B:
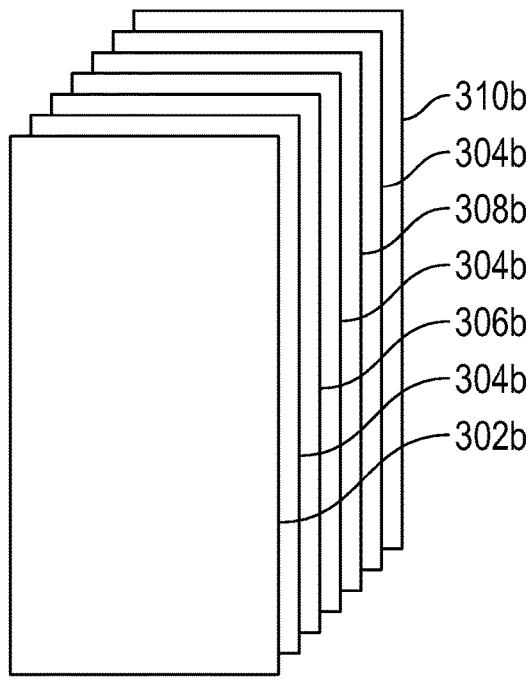
Figure 5A:
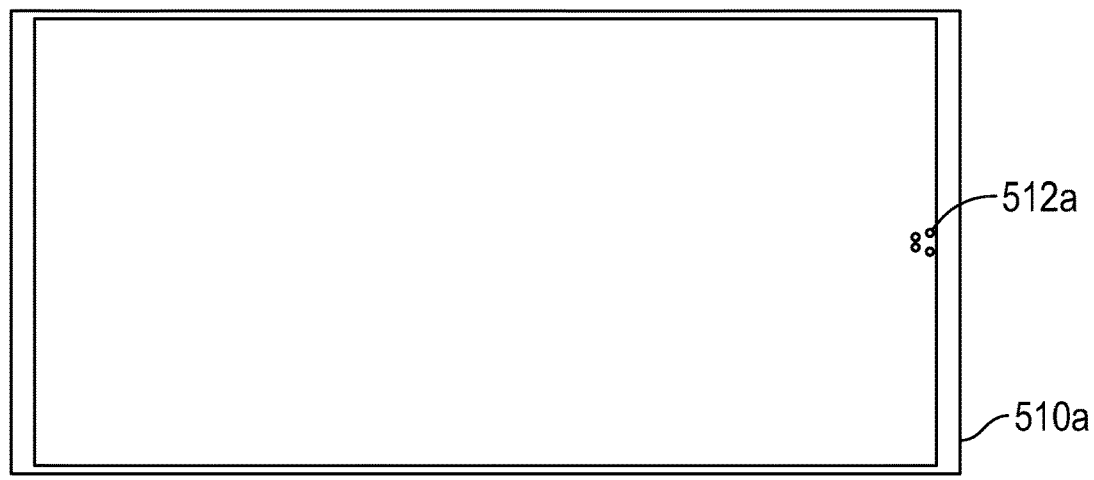
FIGS. 5a & 5b illustrates a top view and side view depicting specially designed SCB's with drilled holes according to the present invention.

FIGS. 1a & 1b illustrates an arrangement of solar cement board with inbuilt solar power generating components. The solar energy generating board is made by involving a plurality of steps like subjecting a base cement panel to drying or dehydrating, sanding and dusting. Laminating the layers such as toughened glass and/or a thin film 102, EVA layers 104, cell matrix 106 and back sheet 108 as shown in FIGS. 3a & 3b. These are accommodated on a specially designed cement board 110 as shown. The specially designed cement board 110 is provided with a plurality of long rectangular profiles to accommodate the laminated layers as shown in FIG. 5a.

The solar cement board 100b comprises a toughened glass and/or a thin film as a top layer 102b, a plurality of middle layers like EVA 104b, cell matrix 106b and a back sheet 108b, a plurality of Solar energy capturing components and a specially treated Fiber cement board or the like as a back board 110b. The solar energy capturing components which are prepared by using multiple layers as shown in FIG. 2b are secured on a plurality of long rectangular profiles in the Fiber cement board or the like as shown in FIG. 1a. The top layer i.e. thin film or toughened glass layer 102b along with other layers is rested on a plurality of webs on the board to strengthen the board and avoid top loads getting transferred to the solar energy capturing components secured in the long rectangular profiles.

The energy generating structure is provided with a free left out web around the board for using it by self-threading screws to affix the boards on to a structure without the need for additional components. A uniquely made tray and a mould are used to specially encapsulate solar energy generating components into the board. Due to more mass of glass compared to thin film sheet, heat dissipation will be faster during power generation. Glass being tempered can withstand any small impacts during installation like dropping of tools, walking on the boards, scratches while moving the materials etc.

Figure 2:
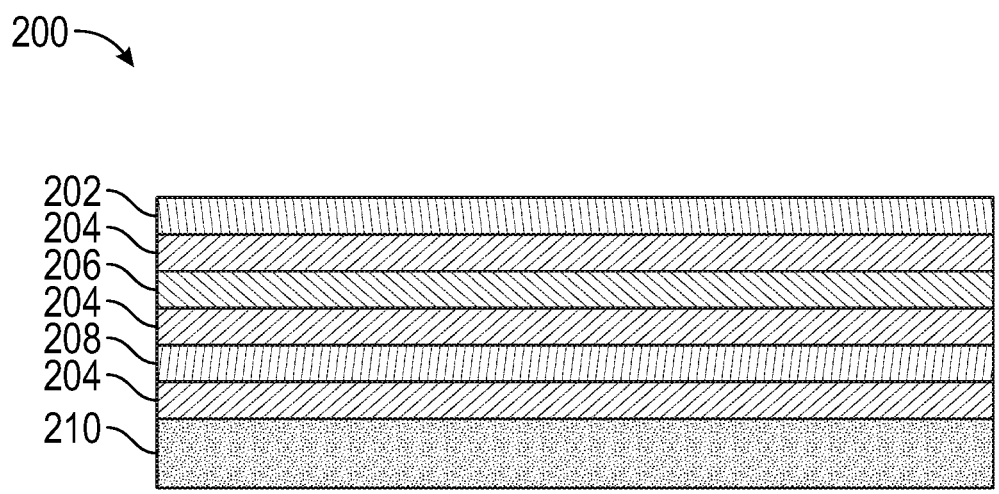
FIG. 2 illustrates a process of preparing different layers of energy generating board according to the present invention.

FIG. 2 illustrates a process 200 of preparing different layers of the Solar Cement Board according to the present invention. The specially treated board consists of multi layers with top layer as toughened glass and/or a thin film 202, the next layer of ethylene vinyl acetate EVA 204, next layer of multiple solar cells connected in series 206, another layer of EVA 204, a layer of poly vinyl fluoride (back sheet) 208, one more layer of EVA 204 and finally the bottom layer is a specially treated Cement board 210 of a suitable thickness. All these layers are laminated together in a vacuum chamber of the laminator machine with a pre-set cycle of temperature and time. After the lamination process, special sealant tape or nonconductive compound is applied around the parameter of the Solar Cement Board to prevent dust and moisture entering the Solar Board.

The Energy generating board is made by involving plurality of steps like subjecting a base cement panel to drying or dehydrating, sanding and dusting. Thereafter coating the cement board to improve its hydrophobic nature with water repellents like Polyurethane (PU) among others.

FIGS. 3a & 3b illustrates layers of solar cement board made with thin film 300a and glass 300b. The solar cement board comprises 300a & 300b comprises plurality of layers such as top layer as toughened glass 302b and/or a thin film 302a, the next layer being an ethylene vinyl acetate EVA 304a & 304b, next layer being multiple solar cells as a matrix connected in series 306a & 306b, another layer of ethylene vinyl acetate EVA 304a & 304b, a layer of poly vinyl fluoride (back sheet) 308a & 308b, one more layer of ethylene vinyl acetate EVA 304a & 304b and finally the bottom layer is a specially treated Cement board 310a & 310b of a suitable thickness (12 mm).

Figure 4A:
FIGS. 4a & 4b illustrates a cross section and top view depicting the difference between conventional solar roofing covering and to that of covering by SCB's according to the present invention.
Figure 4A:
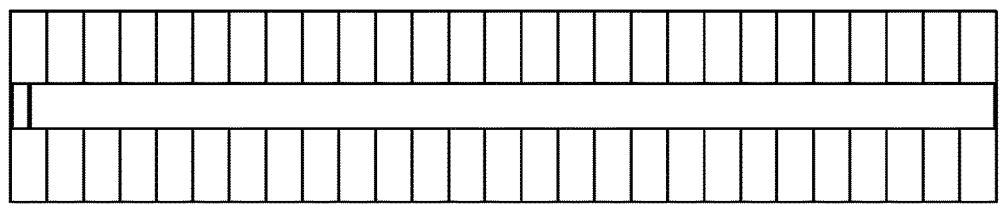
Figure 4B:
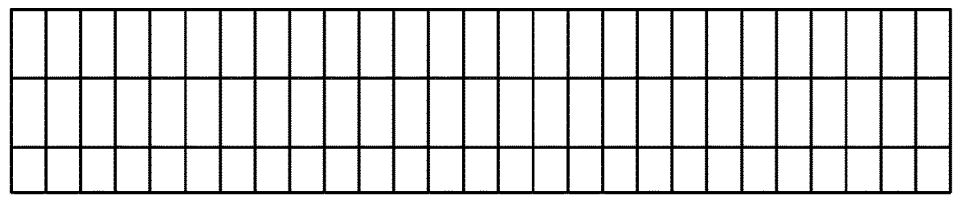

FIGS. 4a & 4b illustrates a cross section & top view 400a & 400b depicting the difference between conventional solar roofing covering and SCB's covering according to the present invention. In conventional solar roofing gaps provided between the panels is normally 50 mm and in between the solar panel rows is 600 mm to 1000 mm to avoid shadow effects. This arrangement wastes a lot of space resulting in less power generation when compared with present solar cement boards.

FIG. 4b shows the arrangement of present solar cement boards covering entire roof area without having any gaps between the solar panel rows. With this, there is 20-30% more floor space covered compared to the conventional solar roofing. In this arrangement the solar roof can generate 20% extra power compared to the conventional solar roofing for the same amount of space as shown in FIGS. 4a & 4b.

Figure 5B:

FIGS. 5a & 5b illustrates a top view 500a and side view 500b depicting the specially designed with drilled holes according to the present invention. The specially designed cement board 510 is provided with a plurality of long rectangular profiles to accommodate a sandwich of toughened glass and/or a thin film, EVA layers, cell matrix and back sheet as shown in FIG. 2 to prepare the energy generating board. 512a are drilled holes to take out the positive and negative leads from the solar matrix.

Figure 6A:
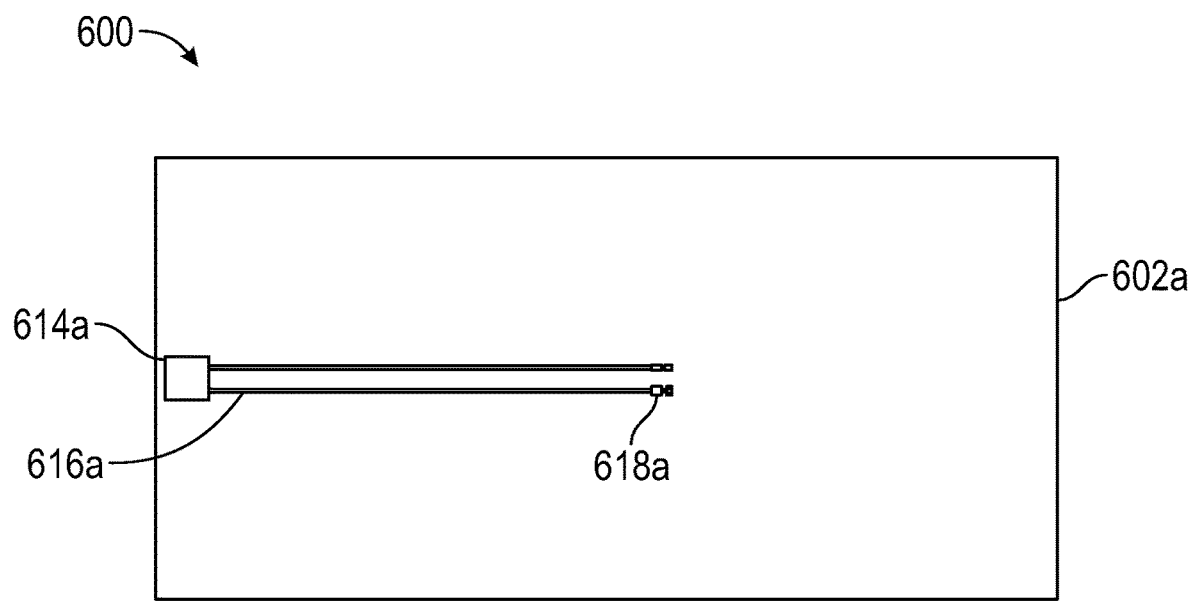
FIGS. 6a & 6b illustrates a top view and side view depicting the junction box mounting details according to the present invention.
Figure 6B:
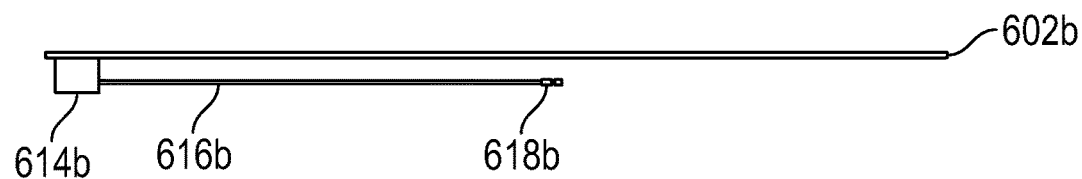

FIGS. 6a & 6b illustrates a top view 600a and side view 600b depicting the junction box mounting details according to the present invention. Once the designed cement board 610a and sandwiched multi layers are laminated together as shown in FIGS. 5a & 5b a junction box 614a is mounted using a silicon sealant on the backside of the specially treated board. A junction box 614a comprises of an output positive and negative leads with a cable 616a and connectors 618 to protect the connections and provide a safety barrier.

Figure 7A:
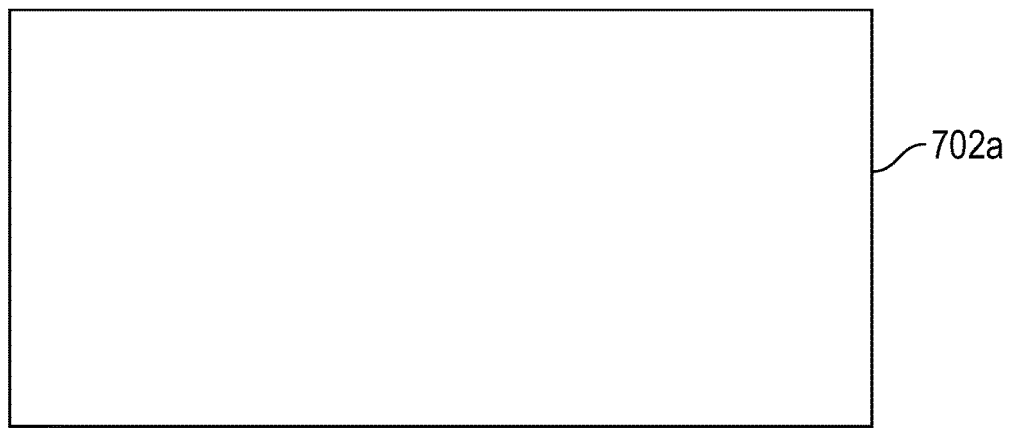
FIGS. 7a & 7b illustrates a top view and side view depicting double sided tape according to the present invention.
Figure 7B:
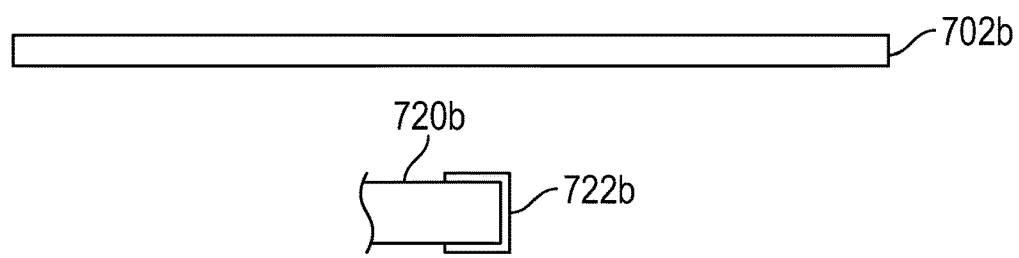

FIGS. 7a & 7b illustrates a top view 700a and side view 700b depicting a SCB frame with double sided tape according to the present invention. After fixing the junction box on the treated cement board as shown in FIGS. 6a & 6b a SCB frame 720b is concealed by using a double-sided tape 722b to prevent any seepage of dust and moisture in to the laminate during the life of the product. After fixing of junction box and framing the BIPV, the solar cement board is kept in an ambient temperature for 24 hours curing to enable bonding of junction box.

After the junction box is bounded with the Fiber cement board or the like, it is inspected in Electro Luminescence EL and Sun Simulator (Flash Tester) machines for checking the quality of product. In EL test, the product is checked for any micro cracks in the solar cells and to check any foreign materials presence inside the product during the manufacturing process. Sun Simulator machine test determines the Maximum Output power Pmp of the solar board along with other parameters like Open Circuit voltage Voc, Maximum peak voltage Vmp, Short circuit current Isc, Maximum peak current Imp, Fill Factor etc.

Measurement of sound insulation in SCB under environmental conditions as per IS 9901-3, DIN 52210-4 and ISO 140-3 are better than any other material claimed in the previous applications. Using filtered noise in one third octave band the air borne sound insulation index was evaluated by measuring the average sound pressure levels generated. On measuring the equivalent absorption in a receiver room with that of a standard reference curve the sound transmission class STC was found to be 29 for SCB.

By using SCBs for the roof we can use the entire roof area without any gaps between the boards which are normally 50 mm between the solar panels and 600 mm to 1000 mm between the solar panel rows in conventional installations. Thus, SCB roof will be able to provide 20% extra power for the same amount of space used.

The Solar Cement board with a 12-mm roof having a density equals to 1250 kg/cum and more, has increased efficiency due to thermal conductivity of 0.072 W/mt K. Its thermal insulation reduces the temperatures by 35-40% inside the building. It is customizable in varied sizes for variety of roof types. When compared to GV sheets, SCB's generates no noise and minimizes the effects of heat and rain. No need of an additional insulation mat under the roof. It is fire resistant and electric shock proof compared to the traditional Galvalume sheets which are dangerous and can cause shock and electrocution. It is a Non-Hazardous material when compared to Galvalume sheets used in traditional rooftop solar installations which conduct radiations and may cause health hazards.

In another embodiment, SCB is not only just a roof for the owner but a revenue generating source for more than 25 years by producing electrical energy. It can be used either for internal consumption or export extra available energy to the electrical grid. In an industrial scenario SCB roof has multiple advantages, due to its very low thermal conductivity, the heat transmitted into the building is very low thus keeping the shop floor congenial for working. The acoustic insulation of the SCB helps lowering the noise during rain compared to a metal roof. Due to the above mentioned, it lowers the requirement of electrical power for keeping the shop floor cooler and finally provides an eco-friendly aesthetic look for the shed.

The loads on solar panels are generally specified with wind forces and weight of the snow in some parts of the world. Apart from winds, snow or rain if we think about laying conventional solar panels covering a roof near to tall trees or other habitations, there could be a chance the roofs get damaged by dropping of tree branches, other dust or animals climbing on to the units. Traditional installations do not provide protection to heavier winds, foreign bodies falling on the panels or provide proper provision to clean the debris and dirt.

The ground reaction force when someone walks is somewhere in the region of 1.5 times the body weight, so every time someone step on a surface whilst moving pushes down with as much as 150 Kgs.

SCB's allow installers weighing around 80-90 Kgs to move, stand on the boards to clean, make installations or corrections. The SCB takes point loads of 50-200 Kgs. The toughened glass and/or the thin film rests on the SCB's webs takes this point load and distribute the same not inciting into the solar generating components.

Figure 8:
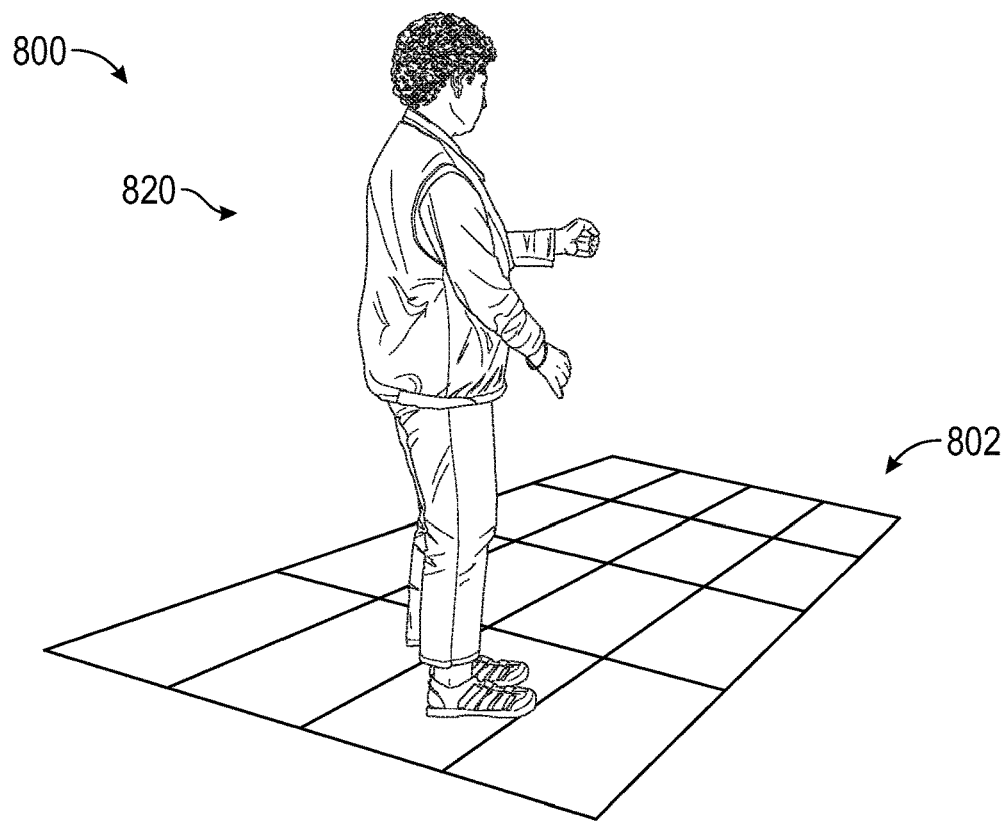
FIG. 8 illustrates a perspective view depicting the strength of an SCB according to the present invention.

FIG. 8 illustrates a perspective view 800 depicting the strength of solar cement board according to the present invention. The solar cement boards with certain length are manufactured by incorporating multiple layers as shown in FIG. 2a. A plurality of solar cement boards is sandwiched on a plurality of webs along with long depression all over the roof area to generate maximum electricity. Self-drilling screws are adapted to be used to fix the solar cement boards to a roof structure. web of about 20-50 mm is provided all around the board to enable the installer to use self-threading screws from top to lock the board without need for external components to fix. Adjacent boards are placed at a gap of about 3-5 mm where the gap is filled with a sealant to cover this gap. The energy generating structure formed with the plurality of SCB's provides a load bearing, leak proof, fire and thermal resistant enclosure.

The SCB is a breakthrough invention in the field of sustainable renewable energy products. It's an Integrated Solar System that serves all the functions of a traditional roof, wall or any conventional building product whilst generating energy for you. An integrated solar panel with a cement base, it reduces thermal conductivity better than any other traditional roof, façade or building product while enhancing the appearance of your building system in terms of roof, façade or other systems.

In other embodiment, the integrated solar roofing system is not only limited for residential purpose but can also be used in commercial, industrial roofs, bus stop shelters, parking lot shelters, green energy charging stations or the like to generate electricity.

The present invention in various embodiments, includes components, methods, processes, systems and/or apparatus substantially as depicted and described herein, including various embodiments, sub combinations, and subsets thereof. Those of skill in the art will understand how to make and use the present invention after reading the detailed description given above.

I claim:

1. An eco-friendly energy generating roof comprising: a plurality of solar boards, each solar board comprising:
    a plurality of long rectangular recesses formed in a specially treated base board as a base;
    a plurality of ridges, wherein the long rectangular recesses and the ridges are provided alternatively such that each ridge is formed between two adjacent long rectangular recesses;
    a plurality of solar energy capturing components secured in the plurality of long rectangular recesses such that the plurality of solar energy capturing components is not disposed on the plurality of ridges;
    a toughened glass and/or a thin film, rested on top of the plurality of ridges along the long rectangular recesses so as to cover the plurality of solar energy capturing components wherein the toughened glass and/or the thin film is not in contact with the plurality of solar energy capturing components such that a load that is to act on a portion of the toughened glass and/or thin film that is directly above the solar energy capturing components is not transferred to the solar energy capturing components, wherein an entire portion of the solar board between the ridges is covered with the plurality of solar energy generating components;
    ethylene vinyl acetate (EVA) film as an encapsulate; and
    polyvinyl fluoride film, wherein
    the energy generating roof provides a load bearing, leak proof, fire and thermal resistant enclosure.

2. The energy generating roof according to claim 1, wherein the solar board comprises a plurality of layers arranged in the below order from top to bottom:
    a layer of toughened glass and/or a thin film on top;
    a layer of EVA;
    a layer of multiple Photo Voltaic (PV) cells connected in series;
    another layer of EVA;
    a layer of pol vinyl fluoride as a back sheet;
    one more layer of EVA; and
    the base board of a suitable thickness, wherein the long rectangular recesses and the ridges on the base board strengthen the solar board and avoids top loads transferring to the solar energy capturing components secured in the long rectangular recesses.

3. The energy generating roof according to claim 1, comprising a tray and a mold to encapsulate the solar energy generating components into the base board.

4. The energy generating roof according to claim 1, having a left-out ridge around the solar board for use of self-threading screws to affix the solar boards to the energy generating roof structure without a need for additional components to fix to the structure.

5. The energy generating roof according to claim 1, wherein the plurality of solar boards are placed adjacently at a gap of about 3-5 mm and the gap is filled with a sealant to prevent foreign bodies being accumulated in between the solar board.

6. The energy generating roof according to claim 1, wherein the base board is a fiber cement board.

7. A solar board, comprising:
a toughened glass and/or a thin film as a top layer;
a plurality of middle layers;
a plurality of solar energy capturing components;
a polyvinyl fluoride film as a back sheet;
a specially treated base board as a base, wherein a plurality of long rectangular recesses and a plurality of ridges are formed in the specially treated base board, wherein the long rectangular recesses and the ridges are provided alternatively such that each ridge is formed between two adjacent long rectangular recesses, wherein the solar energy capturing components are secured in the plurality of long rectangular recesses such that the plurality of solar energy capturing components is not disposed on the plurality of ridges, and wherein the top layer is rested on top of the plurality of ridges along the long rectangular recesses so as to cover the plurality of solar energy capturing components and the top layer is not in contact with the plurality of solar energy capturing components, wherein a load that is to act on a portion of the toughened glass and/or thin film that is directly above the solar energy capturing components is not transferred on to the solar energy capturing components, and wherein an entire portion of the solar board between the ridges is covered with the plurality of solar energy generating components.

8. The solar board according to claim 7, further comprising a junction box with positive and negative connectors for connecting the solar board to an electrical network.

9. The solar board according to claim 8, wherein the junction box is disposed on an underside of the base board.

10. The solar board according to claim 7, wherein the base is made of at least one of: calcium aluminate, Portland cement, or pozzolanic type.

11. The solar board according to claim 7, wherein the base board is made of one of: a ceramic and a plastic plate.

12. The solar board according to claim 7, wherein the solar energy generating components is made of crystalline silicon solar cells, amorphous silicon solar cells, or any other film solar cells.

13. The solar board according to claim 7, wherein the solar boards are connected in series provide an integrated Solar power generating and roofing system.

14. The energy generating roof according to claim 1, wherein gaps between the solar energy capturing components are less than 50 mm and there is no gap between solar panel rows.

15. The solar board according to claim 7, wherein the plurality of ridges of the solar board are provided to take point loads of 50-200 Kgs.

16. The solar board according to claim 7, wherein a ridge of about 20-50 mm is provided around the solar board to enable to lock the solar board.

17. A method of making a solar board for an energy generating roof the method comprising:
forming a base board having a plurality of long rectangular recesses and a plurality of ridges, wherein the long rectangular recesses and the ridges are provided alternatively such that each ridge is formed between two adjacent long rectangular recesses;
subjecting the base board to drying or dehydrating;
sanding, dusting, coating the base board with water repellents;
laminating the base board with a plurality of solar energy capturing components secured in the plurality of long rectangular recesses such that the plurality of solar energy capturing components is not disposed on the plurality of ridges and sandwiched with a toughened glass and/or a thin film rested on top of the plurality of ridges along the plurality of long rectangular recesses so as to cover the plurality of solar energy capturing components, ethylene vinyl acetate film as an encapsulate in the middle, and polyvinyl fluoride film as a back sheet, wherein the toughened glass and/or thin film is not in contact with the plurality of solar energy capturing components and a load that is to act on a portion of the toughened glass and/or thin film that is directly above the solar energy capturing components is not transferred to the plurality of solar energy capturing components, wherein an entire portion of the solar board between the ridges is covered with the plurality of solar energy generating components.

* * * * *